United States Patent
Zarei et al.

(10) Patent No.: US 11,750,307 B2
(45) Date of Patent: Sep. 5, 2023

(54) SPURIOUS SIGNAL DETECTION

(71) Applicant: QUALCOMM Incorporated, San Diego, CA (US)

(72) Inventors: Shahram Zarei, Neunkirchen am Brand (DE); Christian Pietsch, Nuremberg (DE); Jong Hyeon Park, San Jose, CA (US); Keerthi Suria Kumar Arumugam, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 69 days.

(21) Appl. No.: 17/302,607

(22) Filed: May 7, 2021

(65) Prior Publication Data

US 2022/0360347 A1    Nov. 10, 2022

(51) Int. Cl.
*H04B 17/354* (2015.01)
*H04L 27/26* (2006.01)
*H04W 52/14* (2009.01)
*H04B 17/345* (2015.01)

(52) U.S. Cl.
CPC ......... *H04B 17/354* (2015.01); *H04B 17/345* (2015.01); *H04L 27/2614* (2013.01); *H04W 52/146* (2013.01)

(58) Field of Classification Search
CPC . H04B 17/354; H04B 17/345; H04L 27/2614; H04W 52/146
See application file for complete search history.

(56) References Cited

U.S. PATENT DOCUMENTS

| | | | | |
|---|---|---|---|---|
| 2011/0037628 A1* | 2/2011 | Petrovic | ............ | H03M 1/1038 341/120 |
| 2011/0059714 A1* | 3/2011 | Collins, III | ............ | H04B 1/109 455/296 |
| 2011/0188878 A1* | 8/2011 | Watanabe | ............ | H02M 3/335 363/16 |
| 2013/0196609 A1* | 8/2013 | Ancora | ............ | H04B 1/1036 455/78 |
| 2014/0354475 A1* | 12/2014 | Subburaj | ............ | G01S 19/21 342/357.59 |
| 2017/0234675 A1* | 8/2017 | Iddan | ............ | G01B 9/02004 356/479 |
| 2021/0105034 A1* | 4/2021 | Vs | ............ | H04B 1/1607 |
| 2021/0254977 A1* | 8/2021 | Tarleton | ............ | H03L 7/093 |
| 2022/0103401 A1* | 3/2022 | Sood | ............ | H04L 25/03305 |

* cited by examiner

*Primary Examiner* — Jae Y Lee
(74) *Attorney, Agent, or Firm* — Harrity & Harrity LLP/Qualcomm Incorporated

(57) ABSTRACT

Various aspects of the present disclosure generally relate to wireless communication. In some aspects, a wireless device may obtain, in a frequency range, device-specific data for use in determining at least one of a frequency or a power of a spurious signal. The wireless device may generate, based at least in part on the device-specific data, information that indicates the at least one of the frequency or the power of the spurious signal. Numerous other aspects are described.

31 Claims, 7 Drawing Sheets

SPURIOUS SIGNAL DETECTION

FIELD OF THE DISCLOSURE

Aspects of the present disclosure generally relate to wireless communication and to techniques and apparatuses for spurious signal detection.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a wireless device for wireless communication includes a memory and one or more processors, coupled to the memory, configured to: obtain, in a frequency range, device-specific data for use in determining at least one of a frequency or a power of a spurious signal; and generate, based at least in part on the device-specific data, information that indicates the at least one of the frequency or the power of the spurious signal.

In some aspects, a method of wireless communication performed by a wireless device includes obtaining, by the wireless device in a frequency range, device-specific data for use in determining at least one of a frequency or a power of a spurious signal; and generating, by the wireless device based at least in part on the device-specific data, information that indicates the at least one of the frequency or the power of the spurious signal.

In some aspects, a non-transitory computer-readable medium storing a set of instructions for wireless communication includes one or more instructions that, when executed by one or more processors of a wireless device, cause the wireless device to: obtain, in a frequency range, device-specific data for use in determining at least one of a frequency or a power of a spurious signal; and generate, based at least in part on the device-specific data, information that indicates the at least one of the frequency or the power of the spurious signal.

In some aspects, an apparatus for wireless communication includes means for obtaining, in a frequency range, device-specific data for use in determining at least one of a frequency or a power of a spurious signal; and means for generating, based at least in part on the device-specific data, information that indicates the at least one of the frequency or the power of the spurious signal.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, or artificial intelligence-enabled devices). Aspects may be implemented in chip-level components, modular components, non-modular components, non-chip-level components, device-level components, or system-level components. Devices incorporating described aspects and features may include additional components and features for implementation and practice of claimed and described aspects. For example, transmission and reception of wireless signals may include a number of components for analog and digital purposes (e.g., hardware components including antenna, radio frequency (RF) chains, power amplifiers, modulators, buffer, processor(s), interleaver, adders, or summers). It is intended that aspects described herein may be practiced in a wide variety of devices, components, systems, distributed arrangements, or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
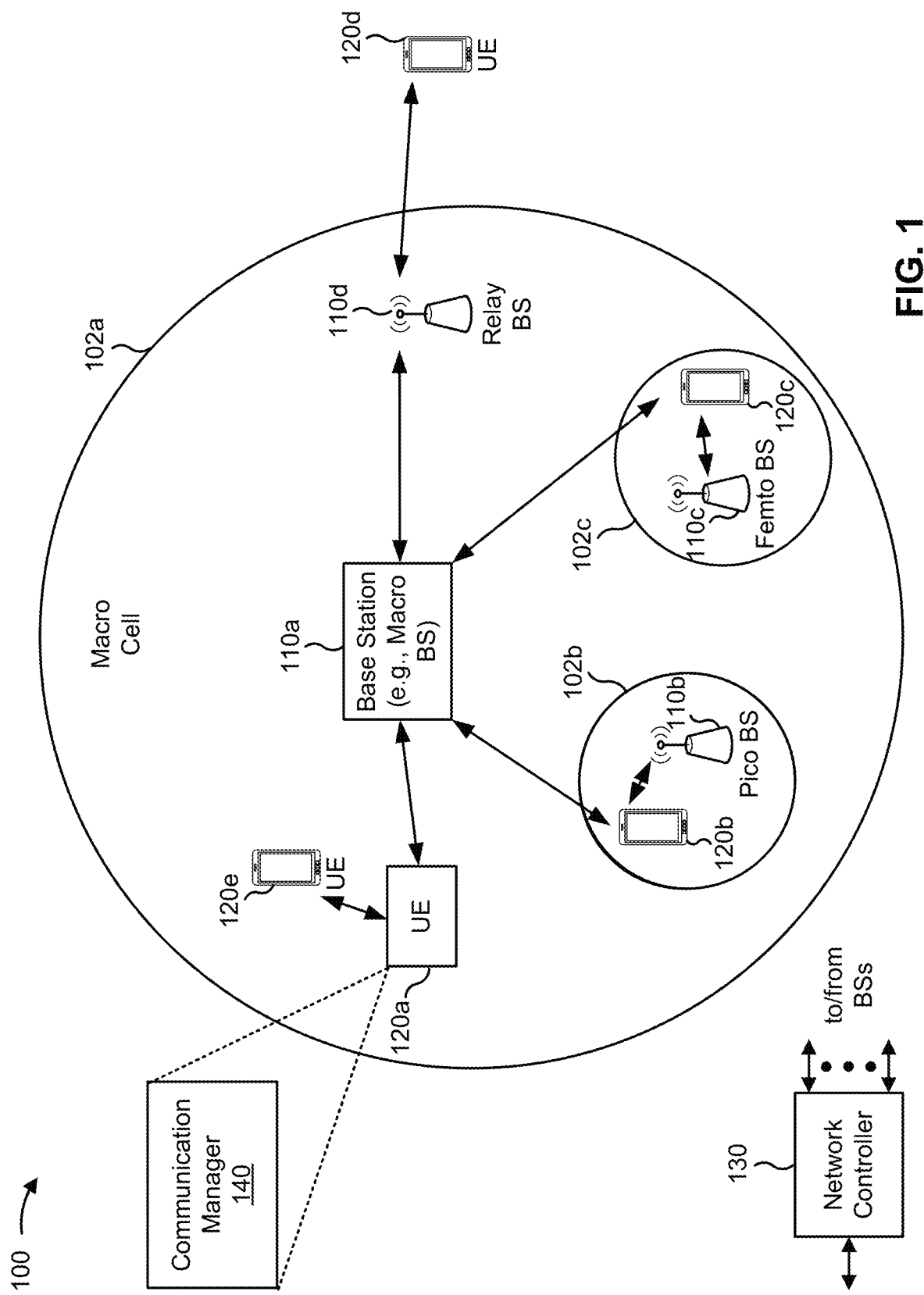
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110*a* and UE 120*d*. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120*a*, 120*b*, 120*c*) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120*a* and UE 120*e*) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

In some aspects, a wireless device (e.g., a UE) may include a communication manager 140. As described in more detail elsewhere herein, the communication manager 140 may obtain, in a frequency range, device-specific data for use in determining at least one of a frequency or a power of a spurious signal; and/or generate, based at least in part on the device-specific data, information that indicates the at least one of the frequency or the power of the spurious signal. Additionally, or alternatively, the communication manager 140 may perform one or more other operations described herein.

As indicated above, FIG. 1 is provided as an example. Other examples may differ from what is described with regard to FIG. 1.

Figure 2:
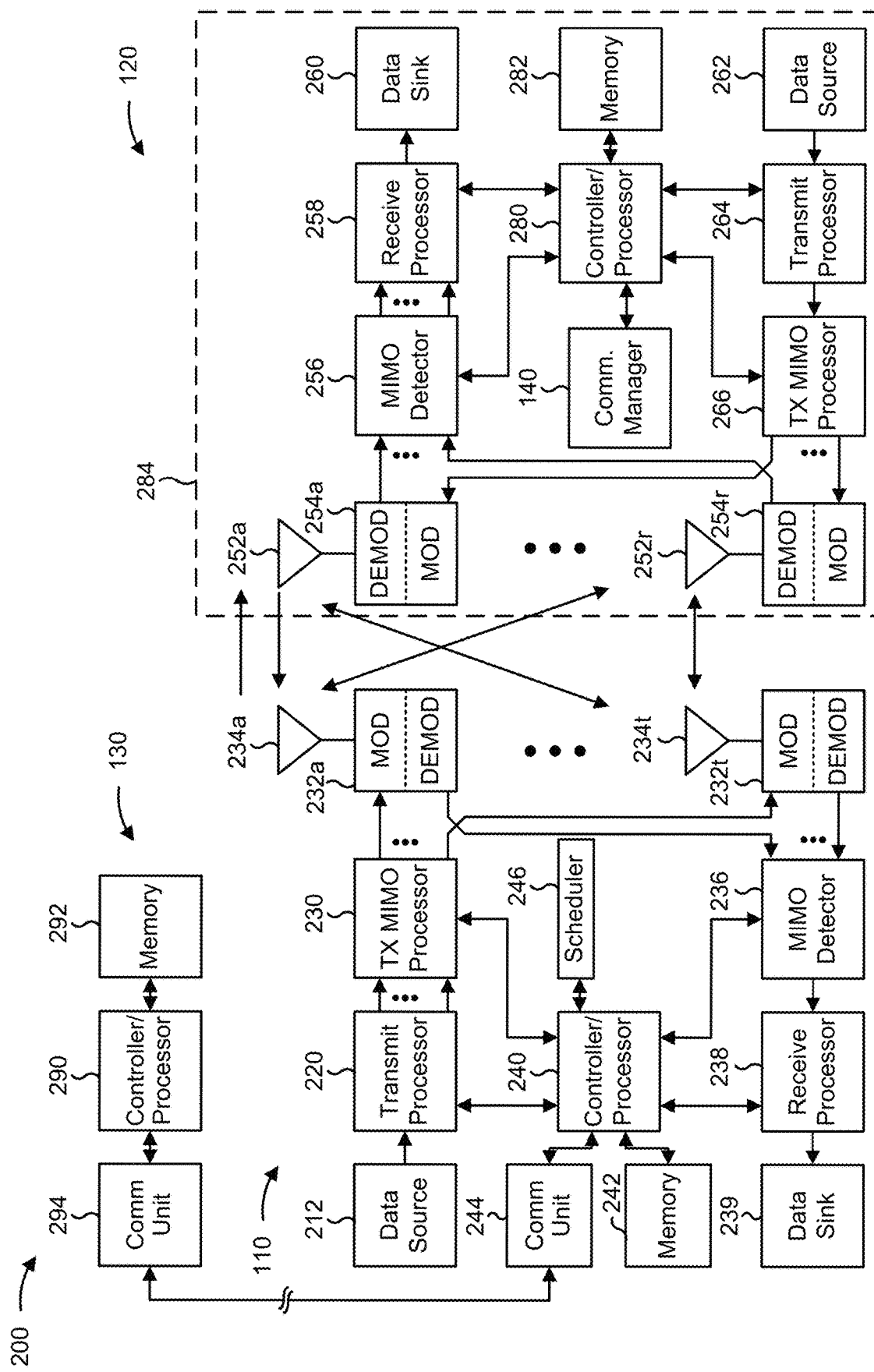
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234*a* through 234*t*, and UE 120 may be equipped with R antennas 252*a* through 252*r*, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate)

the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein, for example, as described with reference to FIGS. 4A-4B and 5.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein, for example, as described with reference to FIGS. 4A-4B and 5.

In some aspects, the wireless device described herein is the UE 120, is included in the UE 120, or includes one or more components of the UE 120 shown in FIG. 2. Controller/processor 240 of base station 110, controller/processor 280 of UE 120, and/or any other component(s) of FIG. 2 may perform one or more techniques associated with spurious signal detection, as described in more detail elsewhere herein. For example, controller/processor 240 of base station 110, controller/processor 280 of UE 120, and/or any other component(s) of FIG. 2 may perform or direct operations of, for example, process 500 of FIG. 5, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 500 of FIG. 5, and/or other processes as described herein. In some aspects, executing instructions may include running the instructions, converting the instructions, compiling the instructions, and/or interpreting the instructions, among other examples.

In some aspects, the wireless device includes means for obtaining, in a frequency range, device-specific data for use in determining at least one of a frequency or a power of a spurious signal; and/or means for generating, based at least in part on the device-specific data, information that indicates the at least one of the frequency or the power of the spurious signal. In some aspects, the means for the wireless device to perform operations described herein may include, for example, one or more of communication manager 140, antenna 252, demodulator 254, MIMO detector 256, receive processor 258, transmit processor 264, TX MIMO processor 266, modulator 254, controller/processor 280, or memory 282.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

Figure 3:
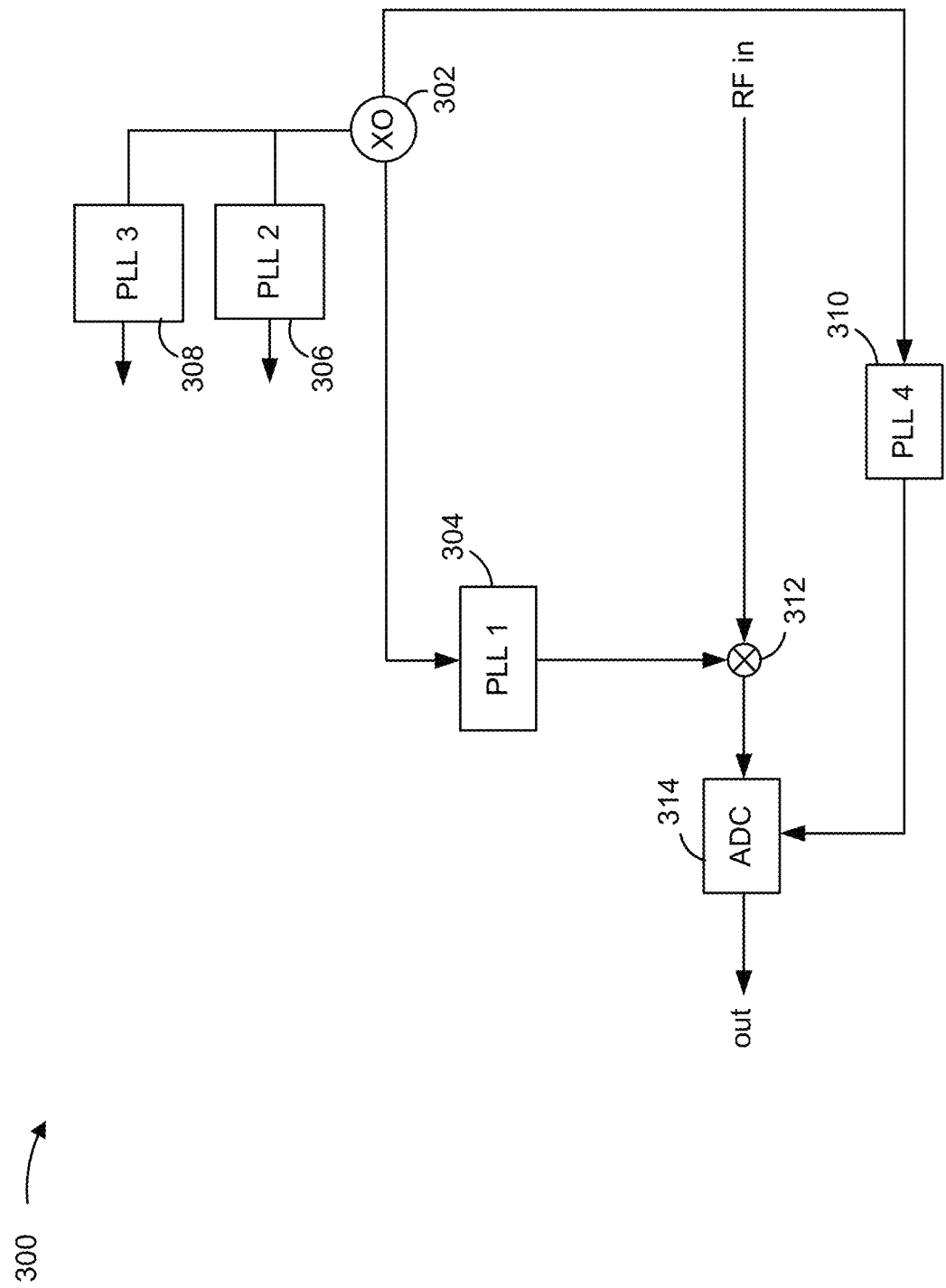
FIG. 3 is a diagram illustrating an example of an intermediate frequency system of a receiver, in accordance with the present disclosure.

FIG. 3 is a diagram illustrating an example 300 of an intermediate frequency (IF) system (e.g., IF chip) of a receiver, in accordance with the present disclosure. The IF system may down-convert an RF signal (e.g., at a carrier frequency) to an IF signal. The IF may be a frequency between a baseband frequency and the carrier frequency.

The IF system may include a crystal (e.g., quartz) oscillator (XO) 302 (or another signal source) and one or more phase locked loops (PLLs) 304, 306, 308, 310. Four PLLs are shown in example 300 as an example, and the IF system may include more or less than four PLLs. The XO 302 may produce a particular frequency and each of the PLLs 304, 306, 308, 310 may produce respective particular frequencies. The PLLs 304, 306, 308, 310 may include one or more PLLs for a digital clock, an analog to digital converter (ADC) clock, a local oscillator (LO) signal, or the like. As shown, the IF system may also include a mixer 312 and/or an ADC 314.

A spurious signal (also referred to as a "spur") is an emission, signal, or product on a frequency or frequencies that is not deliberately created by a device. For example, spurious signals (e.g., spurious impairments) can be intermodulation products of oscillator signals (e.g., XO signals, LO signals, PLL signals, or the like) generated by the IF system. A frequency of a spurious signal may be characterized by the following first-order model represented by Equation 1:

$$f_{spur} = ka \cdot f_a + kb \cdot f_b + \ldots + kN \cdot f_N \quad \text{Equation 1}$$

where $f_a, f_b, \ldots, f_N$ are the frequency components of the IF system (e.g., the frequencies of the oscillator signals), and $ka, kb, \ldots, kN$ are integer coefficients that characterize the intermodulation products. Thus, a source frequency of a spurious signal may be one or more of the frequency components of the IF system. In some examples, the frequency components of the first-order model and/or the quantity of frequency components of the first-order model may be based on the frequency sources of an IF system.

If not suppressed or canceled, spurious signals may degrade a performance of communications of a device. In some cases, to identify strong spurious signals for suppression, the device may utilize characterization information (e.g., a characterization database) that indicates frequencies and powers of spurious signals. However, the positions and strengths of spurious signals indicated by the characterization information are typically based on an average across multiple devices. That is, the characterization information is not device specific, and device-to-device spurious signal power variations may be up to 10 decibels (dB). Accordingly, the device may perform a suppression operation for a spurious signal that is relatively weak at the device (e.g., because the characterization information indicates that the spurious signal is strong), thereby expending processing resources and/or power resources. Moreover, the device may refrain from performing a suppression operation for a spurious signal that is relatively strong at the device (e.g., because the characterization information indicates that the spurious signal is weak), which may degrade a performance of the device.

Some techniques and apparatuses described herein provide device-specific spurious signal detection. For example, a wireless device may perform a spurious signal detection procedure in an online mode of the wireless device (e.g., the spurious signal detection is an online calibration performed by the wireless device). In this way, the spurious signal detection is based at least in part on a current RF configuration and/or IF configuration used by the wireless device.

In some aspects, the wireless device may obtain device-specific data (e.g., data specific to the wireless device) for use in determining a frequency and/or a power of a spurious signal, and generate, based at least in part on the device-specific data, information that indicates the frequency and/or the power of the spurious signal. The wireless device may determine the frequency and/or the power of the spurious signal using a procedure, described below, that has a high degree of precision and low computational complexity. Moreover, the procedure may be performed by the wireless device fast enough to make the procedure feasible for online calibration. For example, the wireless device may perform the procedure in three minutes or less, two minutes or less, one minute or less, or the like (e.g., depending on processor speed). In this way, subsequent spurious signal suppression operations performed by the wireless device may utilize device-specific information, thereby conserving processing and power resources of the wireless device and improving a performance of the wireless device.

As indicated above, FIG. 3 is provided as an example. Other examples may differ from what is described with respect to FIG. 3.

Figure 4A:
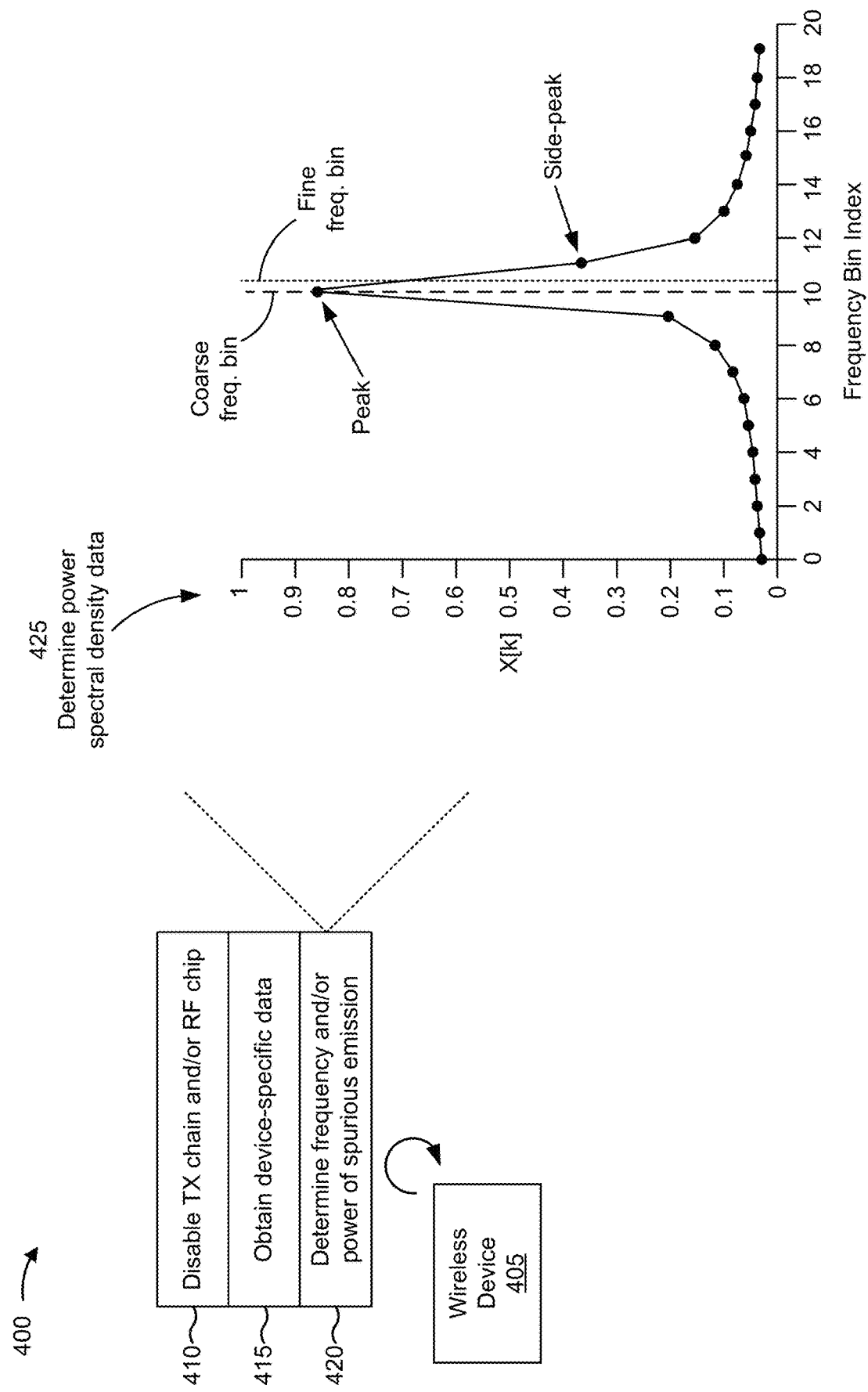
FIGS. 4A-4B are diagrams illustrating examples associated with spurious signal detection, in accordance with the present disclosure.
Figure 4B:
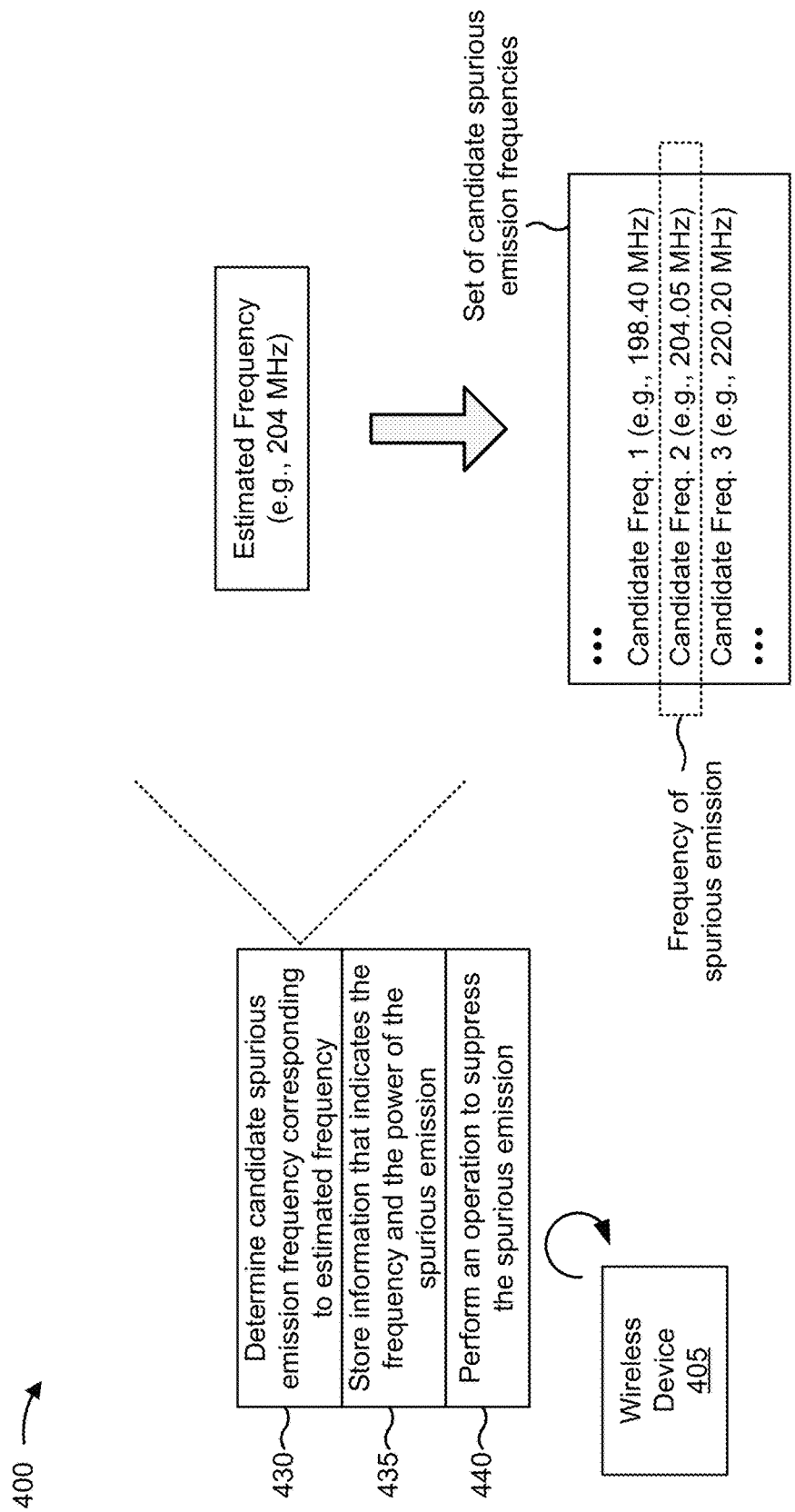

FIGS. 4A and 4B are diagrams illustrating an example 400 associated with spurious signal detection, in accordance with the present disclosure. As shown in FIGS. 4A and 4B, example 400 includes a wireless device 405. In some aspects, the wireless device 405 may be included in a wireless network, such as wireless network 100. In some aspects, the wireless device 405 may be a UE 120 (i.e., a mobile station), a base station 110, or the like. In some aspects, the wireless device 405 may be capable of communication in FR2 (e.g., in a millimeter wave (mmWave) band). In some aspects, the wireless device 405 may include the IF system of the receiver shown in FIG. 3. In some aspects, the wireless device 405 may be provisioned with code for performing a procedure for spurious signal detection (e.g., the procedure for spurious signal detection is performed individually on the wireless device 405, such as in connection with an online calibration of the wireless device 405).

As shown in FIG. 4A, and by reference number 410, the wireless device 405 may disable one or more of a TX chain or an RF chip of the wireless device 405. That is, after the wireless device 405 turns on (e.g., thereby generating spurious signals), the wireless device may turn off a TX chain(s) and/or an RF chip of the wireless device 405. Accordingly, oscillators/PLLs (e.g., of an IF system) responsible for spurious signals remain on. In this way, by disabling the TX chain and/or the RF chip, the wireless device 405 may remove extraneous noise or signals that may affect spurious signal detection. The wireless device 405 may disable the TX chain and/or the RF chip prior to obtaining sample data, as described below.

As shown by reference number 415, the wireless device 405 may obtain device-specific data for use in determining at least one of a frequency or a power of a spurious signal. For example, the wireless device 405 may obtain (e.g., generate) sample data relating to signals in a frequency range. For example, the wireless device 405 may obtain a sample capture (e.g., a wideband sample capture) using a capture mechanism (e.g., after an ADC) of an IF system of the wireless device 405. The signals may include spurious signals (e.g., generated at an IF system of a receiver of the wireless device). The frequency range may be associated with a channel, a bandwidth part, a frequency band, a system bandwidth, or the like. In some aspects, the frequency range is a wideband frequency range. The wireless device 405 may move the sample data to a memory of a modem of the wireless device 405 for processing, as described below.

In some aspects, additionally or alternatively to obtaining the sample data, the wireless device 405 may obtain, in a frequency range (as described above), other data indicating at least one of a frequency or a power of a spurious signal. For example, the wireless device 405 may perform measurement of the power of the spurious signal at a notch filter of the wireless device 405, or the like. As described above, the sample data and/or the other data obtained by the wireless device 405 may be device-specific data. That is, a frequency and/or a power of a spurious signal indicated by the sample data and/or the other data may be particular to the wireless device 405 (e.g., according to a particular hardware configuration, radio configuration, form factor, or the like, of the wireless device 405).

As shown by reference number 420, the wireless device 405 may determine a frequency and/or a power of a spurious signal (e.g., of one of multiple spurious signals) based at least in part on the device-specific data. For example, the wireless device 405 may determine the frequency and/or the power of the spurious signal based at least in part on the sample data and/or the other data. The wireless device 405 may perform a procedure for spurious signal detection to determine a frequency and/or a power of a spurious signal. The wireless device 405 may perform the procedure in an online mode (e.g., during normal operation, such as when the wireless device 405 is connecting to or is connected to a base station) of the wireless device 405. In other words, the wireless device 405 may perform the procedure at any time after an initial (e.g., factory) calibration of the wireless device 405. Moreover, the wireless device 405 may perform the procedure multiple times. In some aspects, the wireless device 405 may perform the procedure periodically, at scheduled times, upon a triggering event (e.g., tuning to a new frequency), or the like.

In some aspects, in connection with the procedure, the wireless device 405 may determine an estimated frequency of the spurious signal based at least in part on the device-specific data. In some aspects, as shown by reference number 425, to determine the estimated frequency of the spurious signal, the wireless device 405 may determine power spectral density data based at least in part on the device-specific data (e.g., the sample data). For example, the wireless device 405 may perform a fast Fourier transform (FFT) of the sample data, and the wireless device 405 may determine the power spectral density data based at least in part on the FFT of the sample data. An FFT size (nFFT) used for the FFT may be below a threshold value. For example, the FFT size used for the FFT may be 4096 or less. In some aspects, the wireless device 405 may compute a power spectral density, based at least in part on the sample data, for example, using Welch's method. Here, the power spectral density may be computed based at least in part on the FFT size (nFFT) and an amount of overlap between data blocks.

The plot shown in FIG. 4 is a graphical representation of example power spectral density data. As shown in the plot, the power spectral density data may identify power measurements (shown by the y-axis) for a plurality of frequency (or FFT) bins (shown by the x-axis). For example, the y-axis may represent normalized amplitude values and the x-axis may represent normalized frequency values. The plot shown in FIG. 4 is provided as an example, and other representations of the power spectral density data are possible.

In some aspects, to determine the estimated frequency of the spurious signal, additionally or alternatively to determining the power spectral density data, the wireless device 405 may determine other frequency domain data based at least in part on the FFT of the device-specific data (e.g., the sample data). Thus, the wireless device 405 may determine the estimated frequency of the spurious signal based at least in part on the power spectral density data, the other frequency domain data, and/or the other data indicating the at least one of the frequency or the power of a spurious signal (e.g., obtained by performing measurement at the notch filter).

In some aspects, the wireless device 405 may determine the estimated frequency of the spurious signal using coarse frequency detection. Using coarse frequency detection, the wireless device 405 may determine the estimated frequency based at least in part on a peak power of the spurious signal. In some aspects, the wireless device 405 may determine the estimated frequency of the spurious signal using coarse frequency detection and fine frequency detection. Using coarse frequency detection and fine frequency detection, the wireless device 405 may determine the estimated frequency based at least in part on a peak power of the spurious signal and an adjacent side-peak power of the spurious signal. The wireless device 405 may perform coarse frequency detection using in-bandwidth information (e.g., information indicating a bandwidth where a carrier may be positioned), so as to ignore spurious signal frequencies outside of the bandwidth. While the description to follow describes the coarse frequency detection and the fine frequency detection using an example of the power spectral density data, different data (e.g., the other frequency domain data) may be used.

In some aspects, using coarse frequency detection, the wireless device 405 may identify a coarse frequency bin of the spurious signal. For example, the wireless device 405 may identify a peak of the power spectral density data, and the coarse frequency bin may be associated with the peak of the power spectral density data. A peak of the power spectral density data may be a power value (e.g., a power value that satisfies a threshold power) of the power spectral density data that is higher than an immediately-preceding power value and an immediately-following power value of the power spectral density data. Thus, using coarse frequency detection (e.g., without using fine frequency detection), the wireless device 405 may determine the estimated frequency of the spurious signal based at least in part on the peak of the power spectral density data (e.g., based at least in part on the coarse frequency bin). In some aspects, the wireless device 405 (e.g., using coarse frequency detection without fine frequency detection) may determine the estimated frequency using Equation 2:

$$f_{spur} = \frac{fs \cdot \hat{k}_c}{nFFT} \qquad \text{Equation 2}$$

where $f_{spur}$ is the estimated frequency of the spurious signal, fs is the sample rate, $\hat{k}_c$ is the frequency bin index associated with the peak, and nFFT is the FFT size. The wireless device 405 may determine the power of the spurious signal based at least in part on the power value associated with the peak.

In some aspects, after using coarse frequency detection to identify the coarse frequency bin of the spurious signal, the wireless device 405 may use fine frequency detection to determine an offset value from the coarse frequency bin, to thereby identify a fine frequency bin of the spurious signal. The offset value may be based at least in part on a frequency bin associated with a peak of the power spectral density data (e.g., the coarse frequency bin) and a frequency bin associated with an adjacent side-peak (e.g., the immediately-following power value) of the power spectral density data. For example, the offset value may indicate a difference of index values between the fine frequency bin and the coarse frequency bin. In some aspects, the wireless device 405 may determine the offset value using Equation 3:

$$\hat{\theta} = \frac{1}{1 + \frac{X[k_m]}{X[k_m + 1]}} \qquad \text{Equation 3}$$

where $\hat{\theta}$ is the offset value, $X[k_m]$ is a square root of the power spectral density (e.g., representing a power value) in frequency bin index m (e.g., the coarse frequency bin, which is bin index 10 as shown), and $X[k_m+1]$ is a square root of the power spectral density (e.g., representing a power value) in a frequency bin adjacent to frequency bin m (e.g., bin index 11 as shown).

Thus, using coarse frequency detection and fine frequency detection, the wireless device 405 may determine the estimated frequency of the spurious signal based at least in part on the peak of the power spectral density data and the adjacent side-peak of the power spectral density data. That is, the wireless device 405 may determine the estimated frequency based at least in part on the coarse frequency bin and the offset value. In some aspects, the wireless device 405 (e.g., using coarse frequency detection and fine frequency detection) may determine the estimated frequency using Equation 4:

$$f_{spur} = \frac{fs \cdot (\hat{k}_c - 1 + \hat{\theta})}{nFFT} \qquad \text{Equation 4}$$

where $f_{spur}$, fs, $\hat{k}_c$, nFFT, and $\hat{\theta}$ are as described above.

In this way, a relationship (e.g., a power ratio) between the peak and the side-peak is exploited to derive the estimated frequency of the spurious signal with a high degree of precision (e.g., a small resolution bandwidth) while using a reasonable FFT size (e.g., 4096). For example, the degree of precision of the estimated frequency may be 100 Hz or less. In the absence of the procedure described herein, a comparable degree of precision (e.g., using an ADC sampling rate of 2 GHz) would require an FFT size of over 19,000,000, which is beyond implementation feasibility using current technology.

As described above, using the power spectral density data is one way that the wireless device 405 may determine the estimated frequency of the spurious signal, and the description herein is not so limited. In some aspects, the wireless device 405 may use different data (e.g., the other frequency domain data) to determine the estimated frequency of the spurious signal (e.g., based at least in part on a peak power and/or an adjacent side-peak power of the spurious signal). Moreover, the wireless device 405 may determine the estimated frequency of the spurious signal with or without performing coarse frequency detection and/or fine frequency detection.

As shown in FIG. 4B, and by reference number 430, in connection with the procedure, the wireless device 405 may determine a candidate spurious signal frequency, from a set of candidate spurious signal frequencies, that corresponds to the estimated frequency of the spurious signal. For example, the wireless device 405 may map the estimated frequency of the spurious signal to a closest candidate spurious signal frequency (e.g., a candidate spurious signal frequency with a value that is closest to a value of the estimated spurious signal frequency) of the set of candidate spurious signal frequencies. Thus, the candidate spurious signal frequency may correspond to the estimated frequency of the spurious signal when a difference in values between the candidate spurious signal frequency and the estimated frequency of the spurious signal satisfies (e.g., is less than) a threshold value. The wireless device 405 may determine that the candidate spurious signal frequency that is determined is the frequency of the spurious signal.

In some aspects, the wireless device 405 (or another device) may obtain the set of candidate spurious signal frequencies using a spurious signal frequency model. For example, the spurious signal frequency model may be the first-order model represented by Equation 1 above. In some aspects, the spurious signal frequency model may be another model that accounts for intermodulation products.

Thus, the spurious signal frequency model may be used to derive a set (e.g., an exact set) of spurious signal frequency positions based on the particular oscillator frequencies (e.g., $f_a, f_b, \ldots, f_N$) used by the wireless device 405 (e.g., by the IF system of the wireless device 405). Thus, the set of candidate spurious signal frequencies may be the result of multiple iterations of the spurious signal frequency model using various values. For example, with reference to Equation 1, the set of candidate spurious signal frequencies may be the result of computing $f_{spur}$ multiple times using different values for the coefficients ka, kb, . . . , kN.

In some aspects, the wireless device 405 may determine the set of candidate spurious signal frequencies when the wireless device 405 is initialized, when the wireless device 405 is turned on, when the wireless device 405 tunes to a new frequency, or the like. In some aspects, the wireless device 405 may determine the set of candidate spurious signal frequencies in real time. For example, the wireless device 405 may determine the set of candidate spurious signal frequencies after determining the estimated frequency for the spurious signal. In some aspects, the wireless device 405 may store information (e.g., a look-up table) indicating the set of candidate spurious signal frequencies.

As shown by reference number 435, the wireless device 405 may store (e.g., in a memory of the wireless device 405) information that indicates the frequency and the power, that were determined by the wireless device 405, of the spurious signal. For example, the wireless device 405 may generate the information that indicates the frequency and the power of the spurious signal, and the wireless device 405 may store the information that is generated. Moreover, the wireless device 405 may generate and store such information for each spurious signal identified by the wireless device 405 in the manner described above. In this way, the wireless device 405 may generate device-specific information indicating frequency positions and powers of spurious signals.

As shown by reference number 440, the wireless device 405 may perform an operation to suppress (e.g., cancel or attenuate) the spurious signal. The wireless device 405 may perform the operation based at least in part on the information that indicates the frequency and the power of the spurious signal (e.g., the wireless device 405 may perform the operation to suppress the spurious signal at the frequency position indicated by the information). For example, the wireless device 405 may perform the operation based at least in part on a determination that the power of the spurious signal satisfies a threshold value (e.g., when the spurious signal is relatively strong). As another example, the wireless device 405 may perform the operation based at least in part on a determination that the frequency of the spurious signal is within a threshold distance of a carrier used by the wireless device 405. In some aspects, to perform the operation to suppress the spurious signal, the wireless device 405 may apply a notch filter (e.g., configured to reject/attenuate signals at the frequency of the spurious signal) to communications of the wireless device 405.

By using device-specific information for spurious signals, the wireless device 405 may suppress spurious signals with improved efficiency and accuracy, thereby conserving processing and power resources of the wireless device 405 and improving a performance of the wireless device 405.

As indicated above, FIG. 4 is provided as an example. Other examples may differ from what is described with respect to FIG. 4.

Figure 5:
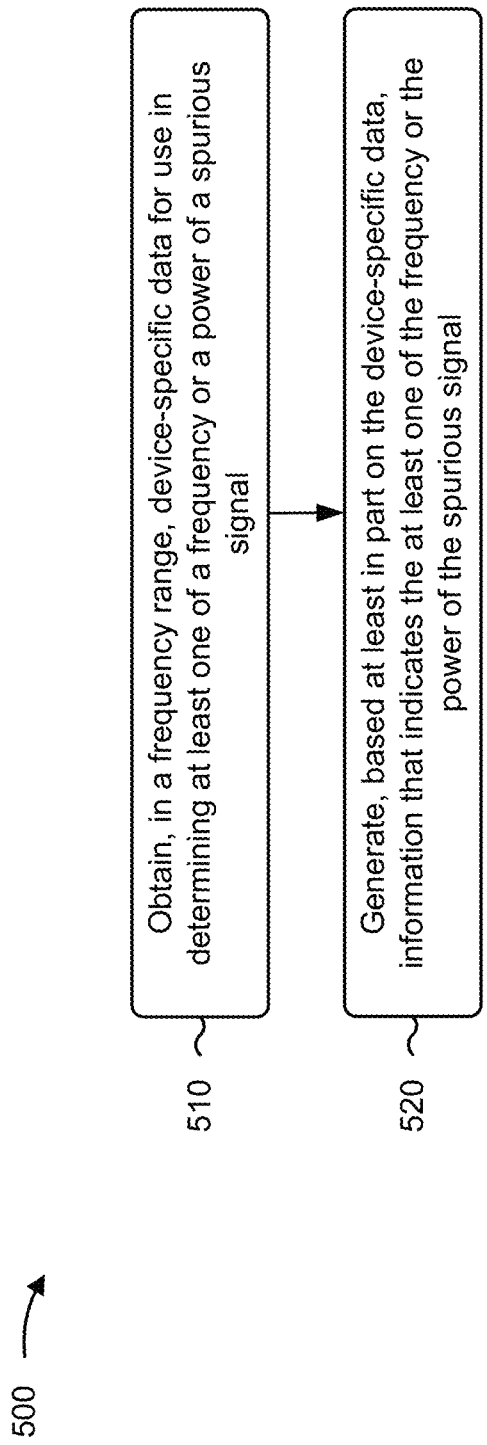
FIG. 5 is a diagram illustrating an example process associated with spurious signal detection, in accordance with the present disclosure.

FIG. 5 is a diagram illustrating an example process 500 performed, for example, by a wireless device, in accordance with the present disclosure. Example process 500 is an example where the wireless device (e.g., wireless device 405, UE 120, base station 110, or the like) performs operations associated with spurious signal detection.

As shown in FIG. 5, in some aspects, process 500 may include obtaining, in a frequency range, device-specific data for use in determining at least one of a frequency or a power of a spurious signal (block 510). For example, the wireless device (e.g., using communication manager 140 and/or data component 608, depicted in FIG. 6) may obtain, in a frequency range, device-specific data for use in determining at least one of a frequency or a power of a spurious signal, as described above.

As further shown in FIG. 5, in some aspects, process 500 may include generating, based at least in part on the device-specific data, information that indicates the at least one of the frequency or the power of the spurious signal (block 520). For example, the wireless device (e.g., using communication manager 140 and/or information component 612, depicted in FIG. 6) may generate, based at least in part on the device-specific data, information that indicates the at least one of the frequency or the power of the spurious signal, as described above.

Process 500 may include additional aspects, such as any single aspect or any combination of aspects described below and/or in connection with one or more other processes described elsewhere herein.

Figure 6:
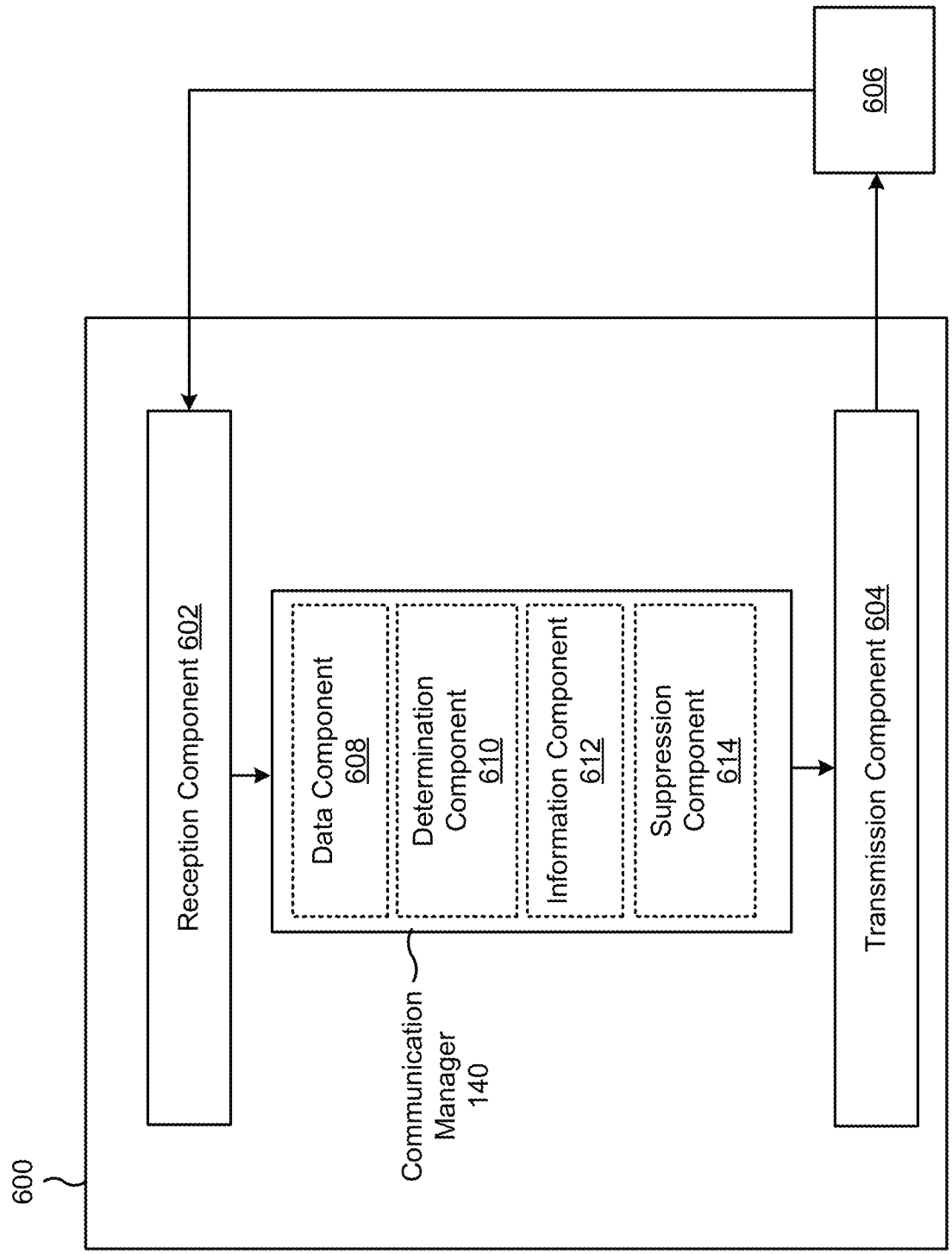
FIG. 6 is a block diagram of an example apparatus for wireless communication, in accordance with the present disclosure.

In a first aspect, process 500 includes determining (e.g., using communication manager 140 and/or determination component 610, depicted in FIG. 6) the frequency of the spurious signal based at least in part on the device-specific data.

In a second aspect, alone or in combination with the first aspect, the frequency of the spurious signal is determined in an online mode of the wireless device.

In a third aspect, alone or in combination with one or more of the first and second aspects, determining the frequency of the spurious signal includes determining, based at least in part on the device-specific data, an estimated frequency of the spurious signal, and determining a candidate spurious signal frequency, obtained using a spurious signal frequency model, that corresponds to the estimated frequency of the spurious signal, where the frequency of the spurious signal is determined to be the candidate spurious signal frequency.

In a fourth aspect, alone or in combination with one or more of the first through third aspects, the candidate spurious signal frequency corresponds to the estimated frequency of the spurious signal when a difference between the candidate spurious signal frequency and the estimated frequency of the spurious signal satisfies a threshold value.

In a fifth aspect, alone or in combination with one or more of the first through fourth aspects, determining the estimated frequency of the spurious signal includes determining, based at least in part on the device-specific data, power spectral density data, and determining the estimated frequency based at least in part on the power spectral density data.

In a sixth aspect, alone or in combination with one or more of the first through fifth aspects, the estimated frequency of the spurious signal is determined based at least in part on a peak power of the spurious signal.

In a seventh aspect, alone or in combination with one or more of the first through sixth aspects, the estimated frequency of the spurious signal is determined based at least in part on a peak power of the spurious signal and an adjacent side-peak power of the spurious signal.

In an eighth aspect, alone or in combination with one or more of the first through seventh aspects, the device-specific data is sample data relating to signals in the frequency range.

In a ninth aspect, alone or in combination with one or more of the first through eighth aspects, process 500 includes disabling (e.g., using communication manager 140 and/or reception component 602/transmission component 604, depicted in FIG. 6) at least one of a transmit chain or a radio frequency chip of the wireless device prior to obtaining the sample data.

In a tenth aspect, alone or in combination with one or more of the first through ninth aspects, process 500 includes storing (e.g., using communication manager 140 and/or information component 612, depicted in FIG. 6) the information that indicates the at least one of the frequency or the power.

In an eleventh aspect, alone or in combination with one or more of the first through tenth aspects, process 500 includes performing (e.g., using communication manager 140 and/or suppression component 614, depicted in FIG. 6) an operation to suppress the spurious signal based at least in part on the information that indicates the at least one of the frequency or the power of the spurious signal.

In a twelfth aspect, alone or in combination with one or more of the first through eleventh aspects, the frequency range is a wideband frequency range.

In a thirteenth aspect, alone or in combination with one or more of the first through twelfth aspects, the wireless device is a mobile station.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a block diagram of an example apparatus 600 for wireless communication. The apparatus 600 may be a wireless device, or a wireless device may include the apparatus 600. In some aspects, the apparatus 600 includes a reception component 602 and a transmission component 604, which may be in communication with one another (for example, via one or more buses and/or one or more other components). As shown, the apparatus 600 may communicate with another apparatus 606 (such as a UE, a base station, or another wireless communication device) using the reception component 602 and the transmission component 604. As further shown, the apparatus 1100 may include the communication manager 140. The communication manager 140) may include one or more of a data component 608, a determination component 610, an information component 612, or a suppression component 614, among other examples.

In some aspects, the apparatus 600 may be configured to perform one or more operations described herein in connection with FIGS. 4A-4B. Additionally, or alternatively, the apparatus 600 may be configured to perform one or more processes described herein, such as process 500 of FIG. 5, or a combination thereof. In some aspects, the apparatus 600 and/or one or more components shown in FIG. 6 may include one or more components of the wireless device (e.g., the UE) described above in connection with FIG. 2. Additionally, or alternatively, one or more components shown in FIG. 6 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 602 may receive communications, such as reference signals, control information, data communications, or a combination thereof, from the apparatus 606. The reception component 602 may provide received communications to one or more other components of the apparatus 600. In some aspects, the reception component 602 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 606. In some aspects, the reception component 602 may include one or more antennas, a demodulator, a MIMO detector, a receive processor, a controller/processor, a memory, or a combination thereof, of the wireless device described above in connection with FIG. 2.

The transmission component 604 may transmit communications, such as reference signals, control information, data communications, or a combination thereof, to the apparatus 606. In some aspects, one or more other components of the apparatus 606 may generate communications and may provide the generated communications to the transmission component 604 for transmission to the apparatus 606. In some aspects, the transmission component 604 may perform signal processing on the generated communications (such as filtering, amplification, modulation, digital-to-analog conversion, multiplexing, interleaving, mapping, or encoding, among other examples), and may transmit the processed signals to the apparatus 606. In some aspects, the transmission component 604 may include one or more antennas, a modulator, a transmit MIMO processor, a transmit processor, a controller/processor, a memory, or a combination thereof, of the wireless device described above in connection with FIG. 2. In some aspects, the transmission component 604 may be co-located with the reception component 602 in a transceiver.

The data component 608 may obtain, in a frequency range, device-specific data for use in determining at least one of a frequency or a power of a spurious signal. The information component 612 may generate, based at least in part on the device-specific data, information that indicates the at least one of the frequency or the power of the spurious signal. The determination component 610 may determine the frequency of the spurious signal based at least in part on the device-specific data. The reception component 602 and/or the transmission component 604 may disable at least one of a transmit chain or a radio frequency chip of the apparatus 600 prior to obtaining the device-specific data (e.g., sample data). The information component 612 may store the information that indicates the at least one of the frequency or the power of the spurious signal. The suppression component 614 may perform an operation to suppress the spurious signal based at least in part on the information that indicates the at least one of the frequency or the power of the spurious signal.

The quantity and arrangement of components shown in FIG. 6 are provided as an example. In practice, there may be additional components, fewer components, different components, or differently arranged components than those shown in FIG. 6. Furthermore, two or more components shown in FIG. 6 may be implemented within a single component, or a single component shown in FIG. 6 may be implemented as multiple, distributed components. Additionally, or alternatively, a set of (one or more) components shown in FIG. 6 may perform one or more functions described as being performed by another set of components shown in FIG. 6.

The following provides an overview of some Aspects of the present disclosure:

Aspect 1: A method of wireless communication performed by a wireless device, comprising: obtaining, by the wireless device in a frequency range, device-specific data for use in determining at least one of a frequency or a power of a spurious signal; and generating, by the wireless device based at least in part on the device-specific data, information that indicates the at least one of the frequency or the power of the spurious signal.

Aspect 2: The method of Aspect 1, further comprising: determining the frequency of the spurious signal based at least in part on the device-specific data.

Aspect 3: The method of Aspect 2, wherein the frequency of the spurious signal is determined in an online mode of the wireless device.

Aspect 4: The method of any of Aspects 2-3, wherein determining the frequency of the spurious signal comprises: determining, based at least in part on the device-specific data, an estimated frequency of the spurious signal; and determining a candidate spurious signal frequency, obtained using a spurious signal frequency model, that corresponds to the estimated frequency of the spurious signal, wherein the frequency of the spurious signal is determined to be the candidate spurious signal frequency.

Aspect 5: The method of Aspect 4, wherein the candidate spurious signal frequency corresponds to the estimated frequency of the spurious signal when a difference between the candidate spurious signal frequency and the estimated frequency of the spurious signal satisfies a threshold value.

Aspect 6: The method of any of Aspects 4-5, wherein determining the estimated frequency of the spurious signal comprises: determining, based at least in part on the device-specific data, power spectral density data; and determining the estimated frequency based at least in part on the power spectral density data.

Aspect 7: The method of any of Aspects 4-6, wherein the estimated frequency of the spurious signal is determined based at least in part on a peak power of the spurious signal.

Aspect 8: The method of any of Aspects 4-6, wherein the estimated frequency of the spurious signal is determined based at least in part on a peak power of the spurious signal and an adjacent side-peak power of the spurious signal.

Aspect 9: The method of any of Aspects 1-8, wherein the device-specific data is sample data relating to signals in the frequency range.

Aspect 10: The method of Aspect 9, further comprising: disabling at least one of a transmit chain or a radio frequency chip of the wireless device prior to obtaining the sample data.

Aspect 11: The method of any of Aspects 1-10, further comprising: storing the information that indicates the at least one of the frequency or the power.

Aspect 12: The method of any of Aspects 1-11, further comprising: performing an operation to suppress the spurious signal based at least in part on the information that indicates the at least one of the frequency or the power of the spurious signal.

Aspect 13: The method of any of Aspects 1-12, wherein the frequency range is a wideband frequency range.

Aspect 14: The method of any of Aspects 1-13, wherein the wireless device is a mobile station.

Aspect 15: An apparatus for wireless communication at a device, comprising a processor; memory coupled with the processor; and instructions stored in the memory and executable by the processor to cause the apparatus to perform the method of one or more Aspects of Aspects 1-14.

Aspect 16: A device for wireless communication, comprising a memory and one or more processors coupled to the memory, the memory and the one or more processors configured to perform the method of one or more Aspects of Aspects 1-14.

Aspect 17: An apparatus for wireless communication, comprising at least one means for performing the method of one or more Aspects of Aspects 1-14.

Aspect 18: A non-transitory computer-readable medium storing code for wireless communication, the code comprising instructions executable by a processor to perform the method of one or more Aspects of Aspects 1-14.

Aspect 19: A non-transitory computer-readable medium storing a set of instructions for wireless communication, the set of instructions comprising one or more instructions that, when executed by one or more processors of a device, cause the device to perform the method of one or more Aspects of Aspects 1-14.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A wireless device for wireless communication, comprising:
   a memory; and
   one or more processors, coupled to the memory, configured to:
      obtain, in a frequency range, device-specific data for use in determining, in an online mode of the wireless device and based at least in part on tuning to a new frequency, at least one of a frequency or a power of a spurious signal, the online mode being a mode of operation during or after establishment of a connection via a wireless network; and
      generate, based at least in part on the device-specific data, information that indicates the at least one of the frequency or the power of the spurious signal.

2. The wireless device of claim 1, wherein the one or more processors are further configured to:
   determine the frequency of the spurious signal based at least in part on the device-specific data.

3. The wireless device of claim 2, wherein the frequency of the spurious signal is determined in the online mode of the wireless device.

4. The wireless device of claim 2, wherein the one or more processors, to determine the frequency of the spurious signal, are configured to:
   determine, based at least in part on the device-specific data, an estimated frequency of the spurious signal; and
   determine a candidate spurious signal frequency, obtained using a spurious signal frequency model, that corresponds to the estimated frequency of the spurious signal,
      wherein the frequency of the spurious signal is determined to be the candidate spurious signal frequency.

5. The wireless device of claim 4, wherein the candidate spurious signal frequency corresponds to the estimated frequency of the spurious signal when a difference between the candidate spurious signal frequency and the estimated frequency of the spurious signal satisfies a threshold value.

6. The wireless device of claim 4, wherein the one or more processors, to determine the estimated frequency of the spurious signal, are configured to:
   determine, based at least in part on the device-specific data, power spectral density data; and
   determine the estimated frequency based at least in part on the power spectral density data.

7. The wireless device of claim 4, wherein the estimated frequency of the spurious signal is determined based at least in part on a peak power of the spurious signal.

8. The wireless device of claim 4, wherein the estimated frequency of the spurious signal is determined based at least in part on a peak power of the spurious signal and an adjacent side-peak power of the spurious signal.

9. The wireless device of claim 1, wherein the device-specific data is sample data relating to signals in the frequency range.

10. The wireless device of claim 9, wherein the one or more processors are further configured to:
    disable at least one of a transmit chain or a radio frequency chip of the wireless device prior to obtaining the sample data.

11. The wireless device of claim 1, wherein the one or more processors are further configured to:
    store the information that indicates the at least one of the frequency or the power.

12. The wireless device of claim 1, wherein the one or more processors are further configured to:
    perform an operation to suppress the spurious signal based at least in part on the information that indicates the at least one of the frequency or the power of the spurious signal.

13. The wireless device of claim 1, wherein the frequency range is a wideband frequency range.

14. The wireless device of claim 1, wherein the wireless device is a mobile station.

15. The wireless device of claim 1, wherein the one or more processors are further configured to:
    determine the at least one of the frequency or the power of the spurious signal periodically, or at scheduled times.

16. A method of wireless communication performed by a wireless device, comprising:
    obtaining, by the wireless device in a frequency range, device-specific data for use in determining, in an online mode of the wireless device and based at least in part on tuning to a new frequency, at least one of a frequency or a power of a spurious signal, the online mode being a mode of operation during or after establishment of a connection via a wireless network; and
    generating, by the wireless device based at least in part on the device-specific data, information that indicates the at least one of the frequency or the power of the spurious signal.

17. The method of claim 16, further comprising:
    determining the frequency of the spurious signal based at least in part on the device-specific data.

18. The method of claim 17, wherein the frequency of the spurious signal is determined in the online mode of the wireless device.

19. The method of claim 17, wherein determining the frequency of the spurious signal comprises:
    determining, based at least in part on the device-specific data, an estimated frequency of the spurious signal; and
    determining a candidate spurious signal frequency, obtained using a spurious signal frequency model, that corresponds to the estimated frequency of the spurious signal,
       wherein the frequency of the spurious signal is determined to be the candidate spurious signal frequency.

20. The method of claim 19, wherein the candidate spurious signal frequency corresponds to the estimated frequency of the spurious signal when a difference between the candidate spurious signal frequency and the estimated frequency of the spurious signal satisfies a threshold value.

21. The method of claim 19, wherein determining the estimated frequency of the spurious signal comprises:
    determining, based at least in part on the device-specific data, power spectral density data; and
    determining the estimated frequency based at least in part on the power spectral density data.

22. The method of claim 19, wherein the estimated frequency of the spurious signal is determined based at least in part on a peak power of the spurious signal.

23. The method of claim 21, wherein the estimated frequency of the spurious signal is determined based at least in part on a peak power of the spurious signal and an adjacent side-peak power of the spurious signal.

24. The method of claim 16, wherein the device-specific data is sample data relating to signals in the frequency range.

25. The method of claim 24, further comprising:
disabling at least one of a transmit chain or a radio frequency chip of the wireless device prior to obtaining the sample data.

26. The method of claim 16, further comprising:
storing the information that indicates the at least one of the frequency or the power.

27. The method of claim 16, further comprising:
performing an operation to suppress the spurious signal based at least in part on the information that indicates the at least one of the frequency or the power of the spurious signal.

28. The method of claim 16, wherein the frequency range is a wideband frequency range.

29. The method of claim 16, wherein the wireless device is a mobile station.

30. A non-transitory computer-readable medium storing a set of instructions for wireless communication, the set of instructions comprising:
one or more instructions that, when executed by one or more processors of a wireless device, cause the wireless device to:
obtain, in a frequency range, device-specific data for use in determining, in an online mode of the wireless device and based at least in part on tuning to a new frequency, at least one of a frequency or a power of a spurious signal, the online mode being a mode of operation during or after establishment of a connection via a wireless network; and
generate, based at least in part on the device-specific data, information that indicates the at least one of the frequency or the power of the spurious signal.

31. An apparatus for wireless communication, comprising:
means for obtaining, in a frequency range, device-specific data for use in determining, in an online mode of the apparatus and based at least in part on tuning to a new frequency, at least one of a frequency or a power of a spurious signal, the online mode being a mode of operation during or after establishment of a connection via a wireless network; and
means for generating, based at least in part on the device-specific data, information that indicates the at least one of the frequency or the power of the spurious signal.

* * * * *